(12) United States Patent
Watanabe

(10) Patent No.: US 6,433,635 B2
(45) Date of Patent: Aug. 13, 2002

(54) AMPLIFIER

(75) Inventor: Shinichi Watanabe, Tokyo (JP)

(73) Assignee: Nippon Precision Circuits Inc., Tokyo (JP)

(*) Notice: Subject to any disclaimer, the term of this patent is extended or adjusted under 35 U.S.C. 154(b) by 0 days.

(21) Appl. No.: 09/837,067

(22) Filed: Apr. 18, 2001

(30) Foreign Application Priority Data

Apr. 26, 2000 (JP) ........................................ 2000-126196

(51) Int. Cl.[7] .............................. H03F 3/45; H03F 3/04
(52) U.S. Cl. ...................... 330/253; 330/255; 330/260; 330/261; 330/301
(58) Field of Search ............................... 330/253, 255, 330/260, 261, 301

(56) References Cited

U.S. PATENT DOCUMENTS

| | | | |
|---|---|---|---|
| 4,730,168 A | * | 3/1988 | Senderowicz et al. |
| 5,285,168 A | * | 2/1994 | Tomatsu et al. |
| 5,754,078 A | | 5/1998 | Tamagawa .................. 330/255 |
| 6,107,882 A | * | 8/2000 | Gabara et al. |

* cited by examiner

Primary Examiner—Patricia Nguyen
(74) Attorney, Agent, or Firm—Jordan and Hamburg LLP

(57) ABSTRACT

To provide an amplifier excellent in temperature characteristic and providing an output signal having small crossover distortion in a wide power source voltage range, voltage values provided to positive phase input terminals of a second and a third amplifier 2 and 3 are made to correspond to voltages between sources and drains of a second P-channel MOS transistor Tr3 and a second N-channel MOS transistor Tr4, a first P-channel MOS transistor Tr1 and a first N-channel MOS transistor Tr2 constituting a power buffer 4, are driven by an output signal of a first operational amplifier 1 via the second and the third amplifiers 2 and 3 and therefore, there can be provided idling currents independently from power source voltage from low power source voltage, there can be provided an output signal having small crossover distortion in a wide power source voltage range and temperature dependency thereof can be improved.

6 Claims, 12 Drawing Sheets

AMPLIFIER

BACKGROUND OF THE INVENTION

1. Field of the Invention

The present invention relates to an operational amplifier having large output current, particularly to an amplifier for driving a headphone and an amplifier for driving a speaker utilized for acoustic apparatus and an amplifier suitable for other heavy load drive.

2. Description of the Related Art

In related arts, according to an amplifier for providing large output current, there are provided circuit constitutions as shown by FIG. 17, FIG. 18 and FIG. 19. For convenience, in the drawings, the same constituent elements are designated by the same notations. According to the circuit constitution shown in FIG. 17, a power buffer is constituted by connecting the sources of a P-channel MOS transistor Tr1 the drain of which is connected to a negative power source terminal VSS (for example, 0V) and an N-channel MOS transistor Tr2 the drain of which is connected to a positive power source terminal VDD (for example, 5V) and providing an output terminal OUT, a resistor RN1 and a constant voltage circuit VN are connected in series between an output terminal of an operational amplifier (hereinafter, simply referred to as OP amplifier) 1 and the positive power source terminal VDD from the side of the positive power source terminal VDD, a connection point connecting the resistor RN1 and the constant voltage circuit VN is connected to the gate of the N-channel MOS transistor Tr2, a resistor RP1 and a constant voltage circuit VP are connected in series between the output terminal of the OP amplifier 1 and the negative power source terminal VSS from the side of the negative power source terminal VSS, a connection point for connecting the resistor RP1 and the constant voltage circuit VP is connected to the gate of the P-channel MOS transistor Tr1 and although not illustrated, a feedback resistor is connected between the output terminal OUT and a negative phase input terminal VINN. Further, feedback resistors are similarly provided also in the circuit constitutions of FIG. 18 and FIG. 19. Although not particularly illustrated, the constant voltage circuits VP and VN are publicly-known constant voltage circuits which are arranged proximately to the P-channel MOS transistor Tr1 and the N-channel MOS transistor Tr2 and are constituted by transistors or diodes and resistors thermally coupled thereto. Thereby, temperature-compensated desired idling current is made to flow to the P-channel MOS transistor Tr1 and the N-channel transistor Tr2 and an alternating current signal applied to the negative phase input terminal VINN of the OP amplifier 1, is amplified with small distortion caused by temperature variation. In this case, the P-channel MOS transistor Tr1 and the N-channel MOS transistor Tr2 carry out only current amplification. FIG. 20 shows a relationship among voltages at respective terminals 11, 12 and 13 and FIG. 21 shows drain currents of the P-channel MOS transistor Tr1 and the N-channel MOS transistor Tr2, that is, idling currents Il1 and Il2, in idling time at which the input signal of the amplifier of FIG. 17 is brought into a no signal state. Voltage at the positive power source terminal VDD is designated by notation VDD and the voltage at the negative power source terminal VSS is designated by notation VSS (0V). A positive phase input terminal VINP of the OP amplifier 1 is fixed to potential VDD-(VDD-VSS)/2 at intermediary voltage of voltages of the positive power source terminal VDD and the negative power source terminal VSS and in the idling time, the intermediary potential is applied also to the negative phase input terminal VINN of the OP amplifier 1 and the terminal 11 is provided with the same voltage.

Further, according to an amplifier of FIG. 18, a power buffer is constituted by connecting the drains of the P-channel MOS transistor Tr1 the source of which is connected to the positive power source terminal VDD and the N-channel MOS transistor Tr2 the source of which is connected to the negative power source terminal VSS and providing the output terminal OUT, a resistor RP1 and a resistor RP2 are connected in series between the output terminal of the OP amplifier 1 and the positive power source terminal VDD, a connection point for connecting the resistors is connected to the gate of the P-channel MOS transistor Tr1, a resistor RN1 and a resistor RN2 are connected in series between the output terminal of the OP amplifier 1 and the negative power source terminal VSS and a connection point for connecting the resistors is connected to the gate of the N-channel MOS transistor Tr2. The P-channel MOS transistor Tr1 and the N-channel MOS transistor Tr2 receive bias voltages produced at the connection points of the resistors and the output signal of the OP amplifier 1 and carry out current amplification and voltage amplification. FIG. 22 shows a relationship among voltages at respective terminals 21, 22 and 23 and the power source voltage in idling time of the amplifier of FIG. 18 and FIG. 23 shows drain currents Id1 and Id2 of the P-channel MOS transistor Tr1 and the N-channel MOS transistor Tr2.

According to an amplifier of FIG. 19, in the amplifier of FIG. 18, the resistors RP1 and RN1 are replaced by constant voltage circuits VP and VN and by the constant voltage circuits VP and VN, idling currents of the P-channel MOS transistor Tr1 and the N-channel MOS transistor Tr2 are determined and by driving the transistors by low impedance, influence of gate capacitance is reduced. That is, according to the amplifier of FIG. 18, values of the respective resistors are reduced for constituting low impedance formation in order to maintain drivability of the P-channel MOS transistor Tr1 and the N-channel MOS transistor Tr2, load on the OP amplifier 1 is increased. According to the amplifier of FIG. 19, large output power is provided without increasing the burden on the OP amplifier 1.

According to the amplifier of FIG. 17, maximum amplitude is reduced by an amount of threshold voltages (hereinafter, simply referred to as "Vth") of the P-channel MOS transistor Tr1 and the N-channel MOS transistor Tr2. In other words, it is difficult to lower the power source voltage. Describing in reference to FIG. 20, in idling time, voltage between the terminal 11 and the terminal 12 coincides with Vth of the N-channel MOS transistor Tr2 and voltage between the terminal 11 and the terminal 13 coincides with Vth of the P-channel MOS transistor Tr1. The maximum amplitude, that is, the range of the output voltage becomes a sum of a voltage value produced by subtracting the voltage 12 from the voltage VDD shown in FIG. 20 and a voltage value produced by subtracting the voltage VSS from the voltage 13. Therefore, when the power source voltage is proximate to the sum of Vth's of the respective transistors, the range of the output voltage is narrowed and amplifying operation becomes impossible at the power source voltage having a value smaller than a voltage value VO at which the voltage VDD intersects with the voltage 12 and the voltage 13 intersects with the voltage VSS.

Further, although connection of the N-channel MOS transistor Tr2 to the side of the positive power source terminal VDD and connection of the P-channel MOS transistor Tr1 to the side of the negative power source terminal VSS, can be carried out in the case of a discrete element, the connections are difficult to form on the same substrate in an integrated state. Therefore, temperature compensation by thermal coupling of the constant voltage circuits VP and VN and the P-channel MOS transistor Tr1 and the N-channel MOS transistor Tr2 which has been possible in the case of the discrete element, becomes insufficient For example, a timing of simultaneously making OFF the P-channel MOS transistor Tr1 and the N-channel MOS transistor Tr2 is widened by temperature variation and there poses a problem of distortion of the output voltage.

According to the amplifier of FIG. 18, the resistors are connected between the output terminal of the OP amplifier 1 and the positive power source terminal VDD and between the output terminal of the OP amplifier 1 and the negative power source terminal VSS and accordingly, the drivability of the P-channel MOS transistor Tr1 and the N-channel MOS transistor Tr2 is sacrificed. Further, when low impedance drive of the gates of the P-channel MOS transistor Tr1 and the N-channel MOS transistor Tr2 is intended to carry out, load is applied on the OP amplifier 1 and when the load on the OP amplifier 1 is intended to alleviate, an RC circuit formed by gate capacitances and the resistors produce low pass filtering operation and high frequency characteristic is deteriorated. Further, in order to provide respective desired idling currents Il1 and Il2 by drain currents Id1 and Id2 as shown by FIG. 23, the power source voltage is also limited. Further, temperature compensation of the P-channel MOS transistor Tr1 and the N-channel MOS transistor Tr2 is also difficult.

The amplifier of FIG. 19 poses a problem of limiting the power source voltage similar to the amplifier of FIG. 18. In addition thereto, since there are provided the constant voltage circuits constituted by transistors, temperature dependencies of the P-channel MOS transistor Tr1 and the N-channel MOS transistor Tr2, are added with those of the transistors constituting the constant voltage circuits and the temperature dependencies are operated in a direction of further depending on temperature.

Hence, it is an object of the invention to aim at restraining of power source voltage dependencies of idling currents of respective transistors constituting a power buffer in an amplifier, promotion of low power source voltage formation, improvement in temperature dependencies of respective transistors and promotion of low impedance formation of signals for driving respective transistors to thereby improve frequency characteristic.

SUMMARY OF THE INVENTION

According to the invention, a first P-channel MOS transistor is arranged on a positive power source side, a first N-channel MOS transistor is arranged on a negative power source side, drains thereof are connected to each other to thereby constitute a power buffer, an output terminal of the power buffer is connected with a negative phase input terminal of a first operational amplifier receiving an input signal, an output signal is generated by a second operational amplifier receiving an output signal of the first operational amplifier at a negative phase input terminal thereof, the output signal is provided to the gate of the first P-channel MOS transistor, an output signal is generated by a third operational amplifier receiving the output signal of the first operational amplifier at a negative phase input terminal thereof and the output signal is provided to the gate of the first N-channel MOS transistor. Voltage values provided to positive phase input terminals of the second and the third amplifiers, are made to correspond to voltages between the sources and the drains of a second P-channel MOS transistor having a temperature characteristic similar to that of the first P-channel MOS transistor and a second N-channel MOS transistor having a temperature characteristic similar to that of the first N-channel MOS transistor, the second and the third amplifiers generate output signals each having a voltage waveform constituting a potential center by a potential lowered from a potential of the source of the first P-channel MOS transistor by an amount of voltage between the source and the drain of the second P-channel MOS transistor and output signals each having a voltage waveform constituting a potential center by a potential higher than the potential of the source of the first N-channel MOS transistor by an amount of a voltage between the source and the drain of the second N-channel MOS transistor, thereby, the power buffer is driven and therefore, idling currents independent from the power source voltage can be provided. Accordingly, low power source voltage formation can be carried out.

Further, temperature variations of the first P-channel MOS transistor and the second N-channel MOS transistor are canceled by each other and temperature dependency of the amplifier is improved.

Further, gates of transistors constituting the power buffer can be driven equivalently at low impedance while holding high impedance in view from sources thereof and frequency characteristic is promoted.

According to an aspect of the invention, there is provided an amplifier comprising a first operational amplifier for receiving an input signal, a power buffer connecting respective drains of a first P-channel MOS transistor and a first N-channel MOS transistor and providing an output terminal at a connection point for connecting the first P-channel MOS transistor and the first N-channel MOS transistor, a second P-channel MOS transistor having a temperature characteristic the same as a temperature characteristic of the first P-channel MOS transistor, a second N-channel MOS transistor having a temperature characteristic the same as a temperature characteristic of the first N-channel MOS transistor, a second operational amplifier for receiving a voltage based on a voltage between a source and a drain of the second P-channel MOS transistor at a positive phase input terminal thereof, receiving an output signal of the first operational amplifier at a negative input terminal thereof, generating an output signal constituting a potential center of a voltage waveform by a potential lowered from a potential of a source of the first P-channel MOS transistor by an amount in correspondence with the voltage between the source and the drain of the second P-channel MOS transistor and driving the first P-channel MOS transistor by the output signal, and a third operational amplifier receiving a voltage based on a voltage between a source and a drain of the second N-channel MOS transistor at a positive input terminal thereof, receiving the output signal from the first operational amplifier at a negative phase input terminal thereof, generating an output signal constituting a potential center of a voltage waveform higher than a potential of a source of the first N-channel MOS transistor by an amount in correspondence with the voltage between the source and the drain of the second N-channel MOS transistor and driving the first N-channel MOS transistor by the output signal.

Further, according to another aspect of the invention, there is provided an amplifier comprising a first operational amplifier for receiving an input signal, a power buffer connecting a source of a first P-channel MOS transistor to a first power source terminal at a first potential, connecting a source of a first N-channel MOS transistor to a second power source terminal at a potential lower than the first potential, connecting drains of the first P-channel MOS transistor and the first N-channel MOS transistor and providing an output terminal at a connection point connecting the drains, a second P-channel MOS transistor connecting a source thereof to the first power source terminal, connecting a drain thereof to the second power source terminal via a first resistor and connecting a gate thereof and the drain, a second N-channel MOS transistor connecting a source thereof to the second power source terminal, connecting a drain thereof to the first power source terminal via a second resistor and connecting a gate thereof and the drain, a second operational amplifier receiving a voltage provided by dividing by resistors, between a terminal at a specific potential between the first potential and the second potential and the drain of the second P-channel transistor at a positive phase input terminal thereof, receiving an output signal of the first operational amplifier at a negative phase input terminal thereof and driving the first P-channel MOS transistor by the output signal, and a third operational amplifier receiving a voltage provided by dividing by resistors, between the terminal at the specific potential and the drain of the second N-channel transistor at a positive phase input terminal thereof, receiving the output signal of the first operational amplifier at a negative phase input terminal thereof and driving the first N-channel MOS transistor by the output signal.

It is preferable that a feedback resistor is provided between a negative phase input terminal of the first operational amplifier and the output terminal of the power buffer.

It is preferable that the second operational amplifier and the third operational amplifier are provided with a unity gain.

It is preferable that the specific potential is an intermediary potential between the first potential and the second potential, a voltage produced at a connection point for connecting a pair of resistors connected between the terminal at the specific potential and the drain of the second P-channel MOS transistor, is provided to the positive phase input terminal of the second amplifier and a voltage produced at a connection point for connecting a pair of resistors connected between the terminal at the specific potential and the drain of the second N-channel MOS transistor, is provided to the positive phase input terminal of the third amplifier.

It is preferable that the first P-channel MOS transistor, the second P-channel MOS transistor, the first N-channel MOS transistor and the second N-channel MOS transistor are formed on a same substrate.

DETAILED DESCRIPTION OF THE PREFERRED EMBODIMENTS

Figure 1:
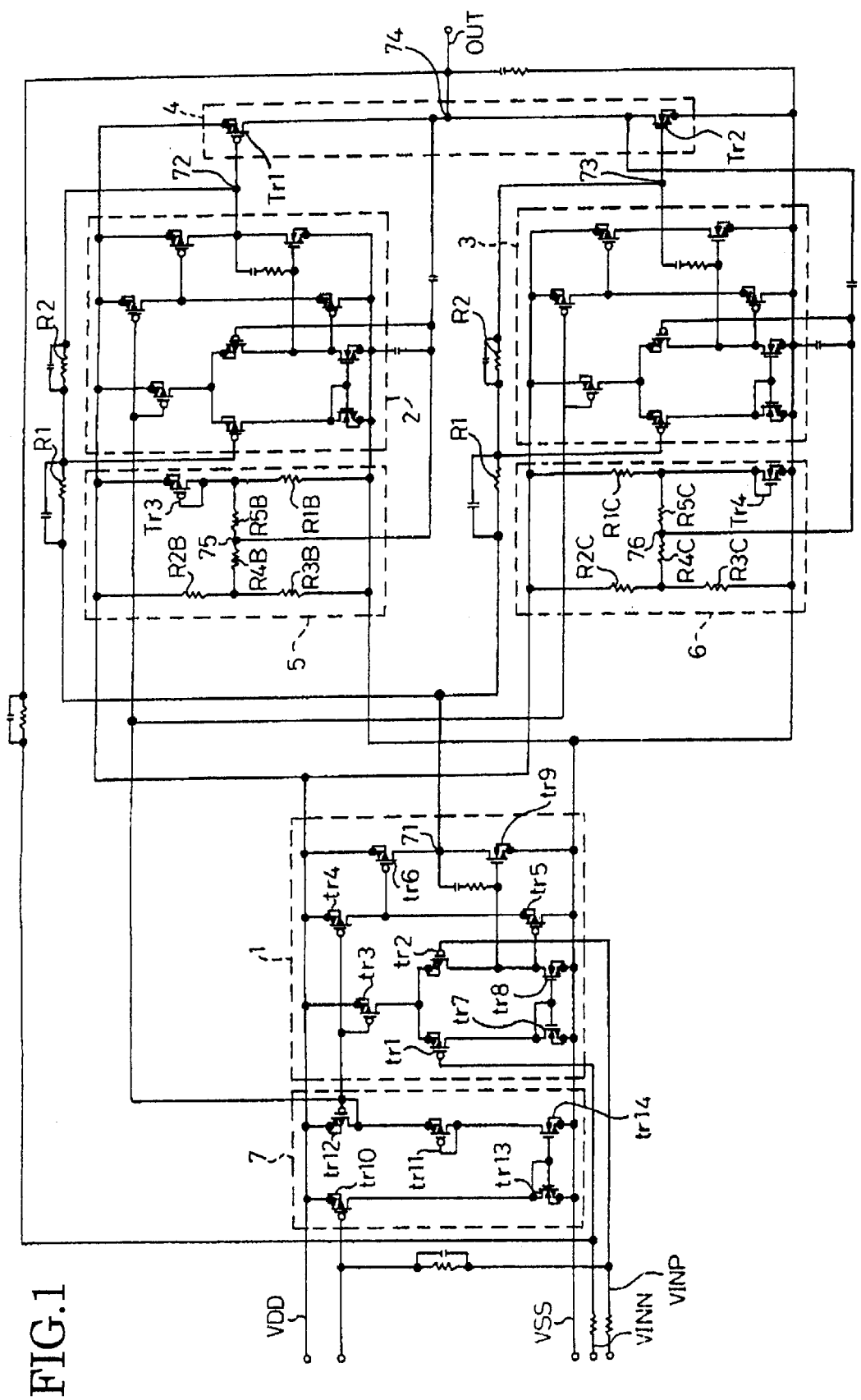
FIG. 1 is an electric circuit diagram for explaining a constitution of an amplifier according to an embodiment of the invention.

An explanation will be given of details of an operational amplifier according to the invention in line with an embodiment shown in FIG. 1 as follows. First, an explanation will be given of a constitution of the example. In the drawing, a first, a second and a third operational amplifier (hereinafter, referred to as OP amplifier) 1, 2 and 3 are publicly-known operational amplifiers each constituted by P-channel MOS transistors tr1 through tr6 and N-channel MOS transistors tr7 through tr9, the P-channel MOS transistor tr1 constitutes a negative phase input terminal, the P-channel MOS transistor tr2 constitutes a positive phase input terminal and a connection point for connecting the P-channel MOS transistor tr6 and the N-channel MOS transistor tr9, constitutes an output terminal. According to the OP amplifier 1, a positive phase input terminal VINP thereof is biased to intermediary potential between a positive power source terminal VDD and a negative power source terminal VSS and a negative phase input terminal VINN thereof receives an input signal. According to the OP amplifier 2, a negative phase input terminal thereof receives an output of the OP amplifier 1 and a positive phase input terminal thereof receives bias voltage formed by a bridge circuit, described later. According to the OP amplifier 3, a negative phase input terminal thereof receives the output of the OP amplifier 1 and a positive phase input terminal thereof receives bias voltage formed by a bridge circuit, described later. The OP amplifiers 2 and 3 are set to constitute unity gain by resistors R1 and feedback resistors R2.

A power buffer 4 is constituted by connecting in series between a first P-channel MOS transistor Tr1 and a first N-channel MOS transistor Tr2 between the positive power source terminal VDD and the negative power source terminal VSS in this order and providing an output terminal OUT at a connection point constituted by connecting the drains of the first P-channel MOS transistor Tr1 and the first N-channel MOS transistor Tr2. Sizes of the first P-channel MOS transistor Tr1 and the first N-channel MOS transistor Tr2 are made larger than those of the MOS transistors constituting the OP amplifiers 1 through 3 and the first P-channel MOS transistor Tr1 and the first N-channel MOS transistor Tr2 can output large power for sufficiently driving load of several Ω through several tens Ω of a headphone or a speaker.

The gate of the first P-channel MOS transistor Tr1 receives an output of the OP amplifier 2 and the gate of the first N-channel MOS transistor Tr2 receives an output of the OP amplifier 3. The output terminal OUT is connected to the negative phase input terminal of the OP amplifier 1 via a feedback resistor.

A bridge circuit 5 is constituted by resistors R1B through R5B and a second P-channel MOS transistor Tr3. The resistors R2B and R3B are connected in series between the positive power source terminal VDD and the negative power source terminal VSS and potential of a connection point for connecting the resistors R2B and R3B is made intermediary potential between the positive power source terminal VDD and the negative power source terminal VSS. The P-channel MOS transistor Tr3 and the resistor R1B are connected in series between the positive power source terminal VDD and the negative power source terminal VSS in this order. A connection point for connecting the P-channel MOS transistor Tr3 and the resistor R1B and a connection point for connecting the resistor R2B and the resistor R3B, are connected via the resistors R4B and R5B, a connection point for connecting the resistor R4B and the resistor R5B is connected to the positive phase input terminal of the OP amplifier 2 and voltage produced at the connection point is given to the OP amplifier 2 as bias voltage.

The bridge circuit 6 is constituted by resistors R1C through R5C and a second N-channel MOS transistor Tr3. The resistors R2C and R3C are connected in series between the positive power source terminal VDD and the negative power source terminal VSS. The resistor R1C and the N-channel MOS transistor Tr4 are connected in series between the positive power source terminal VDD and the negative power source terminal VSS in this order. A connection point for connecting the N-channel MOS transistor Tr4 and the resistor R1C and a connection point for connecting the resistor R2C and the resistor R3C, are connected via the resistors R4C and R5C, a connection point for connecting the resistor R4C and the resistor R5C is connected to the positive phase input terminal of the OP amplifier 3 and voltage produced at the connection point is given to the OP amplifier 3 as bias voltage.

Further, a bias circuit 7 is constituted by P-channel MOS transistors tr10 through tr12 and N-channel MOS transistors tr13 and tr14 and gives bias voltage to the gates of the P-channel MOS transistors tr3 and tr4 of the OP amplifiers 1 through 3 to bring the P-channel MOS transistors tr3 and tr4 into an operational state.

Next, an explanation will be given of operation of the invention in reference to FIG. 1 and while illustrating voltage and current waveforms at respective terminals of the drawing. First, the input signal is brought into a no signal state, a relationship among voltages of respective terminals and power source voltage is shown by FIG. 2 and a description will be given in reference to the drawing. In the drawing, the ordinate designates voltages of respective terminals and the abscissa designates power source voltage. In this case, the negative power source terminal VSS is set to 0V to constitute a reference and voltages of respective terminals with respect to voltage of the positive power source terminal VDD are shown.

According to the bridge circuit 5, the gate and the drain of the second P-channel MOS transistor Tr3 are connected to each other and voltage of the drain indicates a characteristic of Tr3 of the drawing. Voltage across the positive power source terminal VDD and the negative power source terminal VSS is divided by the resistors R2B and R3B and the connection point for connecting the resistors R2B and R3B is brought into intermediary potential between the positive power source terminal VDD and the negative power source terminal VSS. The intermediary potential indicates a characteristic of VDD-(VDD-VSS)/2 of FIG. 2. As shown by the drawing, in the no signal state of the input signal, voltages of the output terminal 71, the negative phase input terminal VINN and the positive phase input terminal VINP of the OP amplifier 1 also become intermediary potential between the positive power source terminal VDD and the negative power source terminal VSS. Further, voltage between potential of the connection point for connecting the second P-channel MOS transistor Tr3 and the resistor R1B and the intermediary potential, is divided by the resistor R4B and the resistor R5B and voltage having a characteristic shown by 75 of FIG. 2 is generated at the connection point 75.

Figure 3:
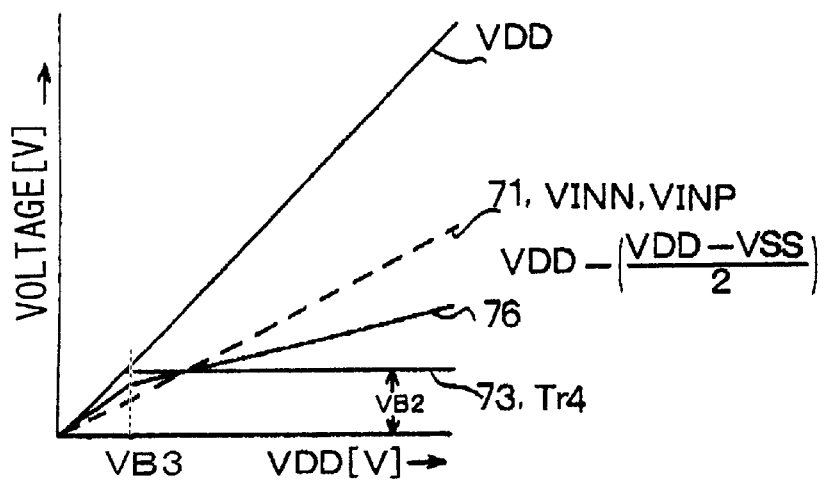
FIG. 3 is a characteristic diagram showing a relationship among voltages of respective terminals and the power source voltage of the amplifier shown in FIG. 1.

Similarly, according to the bridge circuit 6, the gate and the drain of the second N-channel MOS transistor Tr4 are connected to each other and voltage of the drain indicates a characteristic of Tr4 of FIG. 3. The connection point for connecting the resistors R2C and R3C is brought into intermediary potential between the power source terminal VDD and the negative power source terminal VSS. Voltage between potential of the connection point for connecting the second N-channel MOS transistor Tr4 and the resistor R1C and the intermediary potential, is divided by the resistor R4C and the resistor R5C and voltage having a characteristic shown by 76 of FIG. 3 is generated at the connection point 76.

By providing voltage of the connection point 75 to the positive phase input terminal of the OP amplifier 2 and providing voltage of the output terminal 71 of the OP amplifier 1 to the negative phase input terminal, at the output terminal 72 of the OP amplifier 2, as shown by 72 of FIG. 2, there is generated voltage substantially the same as the voltage of the drain of the second P-channel MOS transistor Tr3. The voltage is applied to the gate of the first P-channel MOS transistor Tr1 to thereby constitute bias voltage VB1 with the power source terminal VDD as a reference.

Similarly, by providing voltage of the connection point 76 to the positive phase input terminal of the OP amplifier 3 and providing voltage of the output terminal 71 of the OP amplifier 1 to the negative phase input terminal, at the output terminal 73 of the OP amplifier 3, as shown by 73 of FIG. 3, there is generated voltage substantially the same as the voltage of the drain of the second N-channel MOS transistor Tr4. The voltage is applied to the gate of the first N-channel MOS transistor Tr2 to thereby constitute bias voltage VB2 with the power source terminal VSS as a reference.

Figure 4:
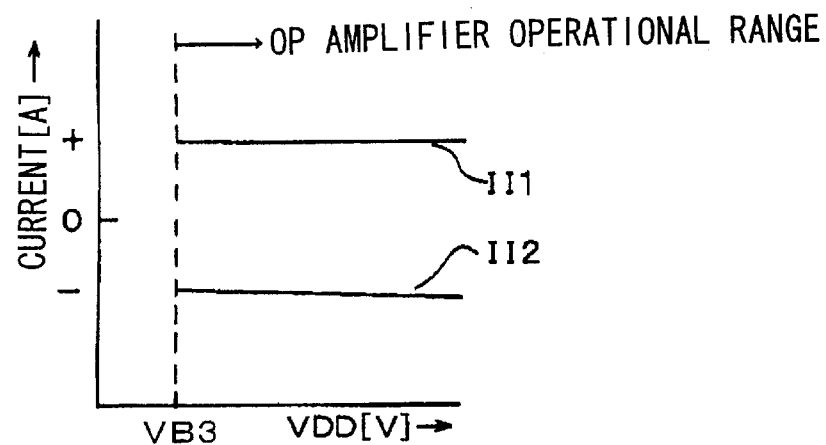
FIG. 4 is a characteristic diagram showing a relationship among currents of the respective terminals and the power source voltage of the amplifier shown in FIG. 1.

As shown by 72 of FIG. 2 and 73 of FIG. 3, the bias voltages VB1 and VB2 are constant independently from the power source voltage and can be generated from low power source voltage at vicinities of Vth of the second P-channel MOS transistor Tr3 and the second N-channel MOS transistor Tr4. Thereby, as shown by FIG. 4, idling currents II1 and II2 can respectively be made to flow to the first P-channel MOS transistor Tr1 and the first N-channel MOS transistor Tr2 independently from power source voltage from low power source voltage VB3 (shown also in FIG. 2, FIG. 3). Directions of the idling currents II1 and II2 are defined as positive by directions from the source to the drain of the respective MOS transistors.

Figure 5:
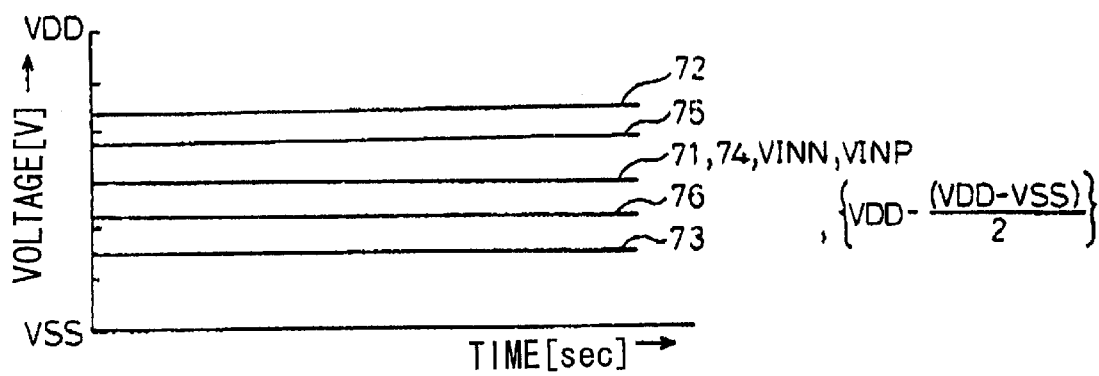
FIG. 5 is a waveform diagram showing voltages of the a respective terminals in a no signal state of an input signal of the amplifier shown in FIG. 1.
Figure 6:
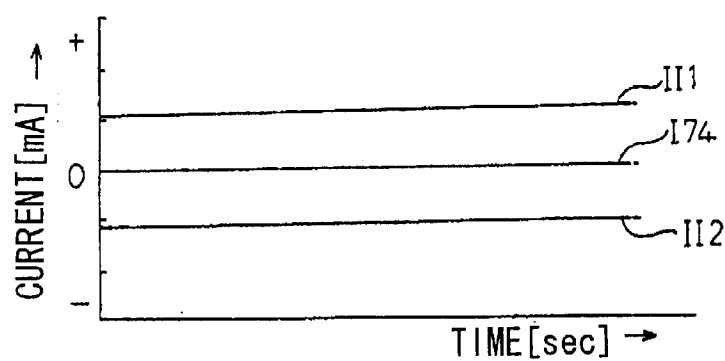
FIG. 6 is a waveform diagram showing currents of the respective terminals in the no signal state of the input signal of the amplifier shown in FIG. 1.

Voltage waveforms of the respective terminal in the no signal state under specific power source voltage become as shown by FIG. 5. In the drawing, numeral 74 designates voltage of the terminal 74, that is, the output terminal OUT and a voltage value thereof becomes a value equal to that of the terminal 71. In this case, current waveforms of the respective terminals are as shown by FIG. 6. A value of current I74 flowing from the terminal 74 to load (not illustrated) of a headphone or the like connected to the terminal and from the load to intermediary potential, becomes 0mA by synthesizing the idling current II1 and the idling current II2.

Figure 7:
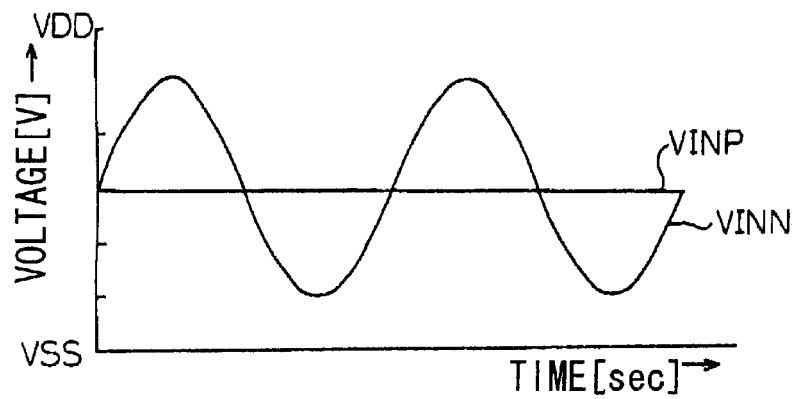
FIG. 7 is a waveform diagram showing voltage waveform of an example of the input signal of the amplifier shown in FIG. 1.
Figure 8:
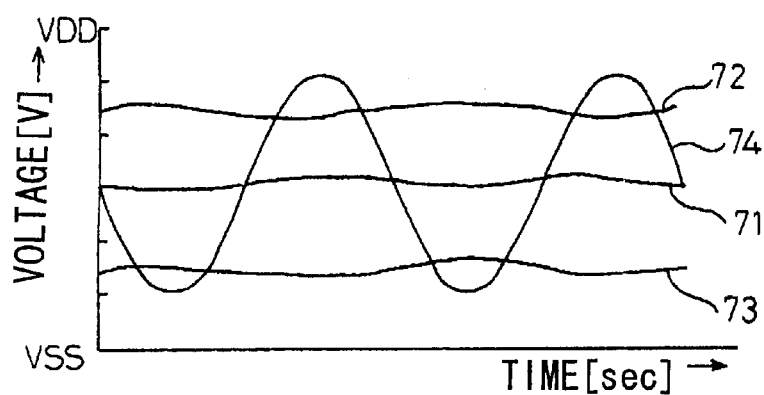
FIG. 8 is a waveform diagram showing voltages of the respective terminals of the amplifier shown in FIG. 1 for receiving the input signal shown in FIG. 7 and driving light load.
Figure 9:
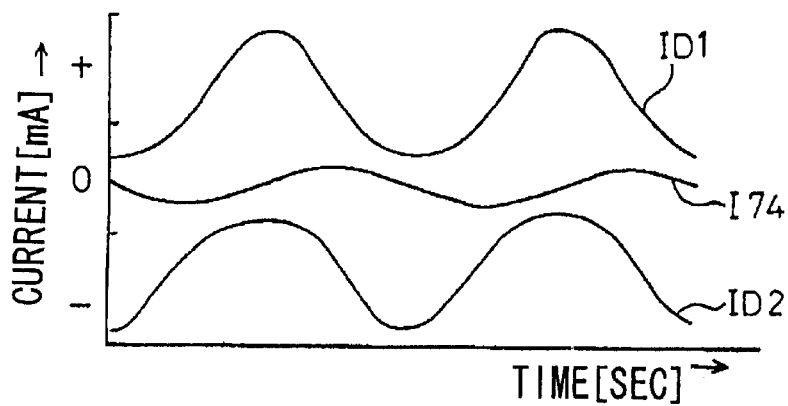
FIG. 9 is a waveform diagram showing currents of the respective terminals of the amplifier shown in FIG. 1 for receiving the input signal shown in FIG. 7 and driving light load.
Figure 10:
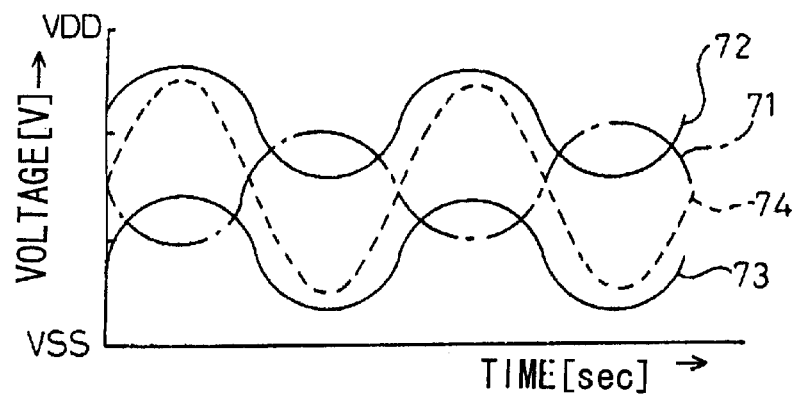
FIG. 10 is a waveform diagram showing voltages of the respective terminals of the amplifier shown in FIG. 1 for receiving the input signal shown in FIG. 7 and driving heavy load.
Figure 11:
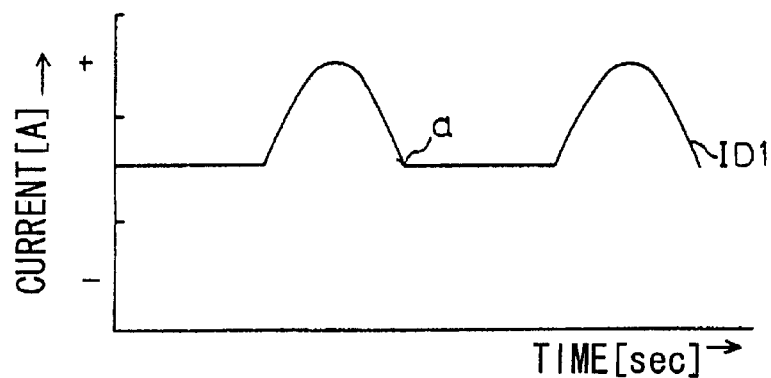
FIG. 11 is a waveform diagram showing drain current of a first P-channel MOS transistor of the amplifier shown in FIG. 1 for receiving the input signal shown in FIG. 7 and driving heavy load.
Figure 12:
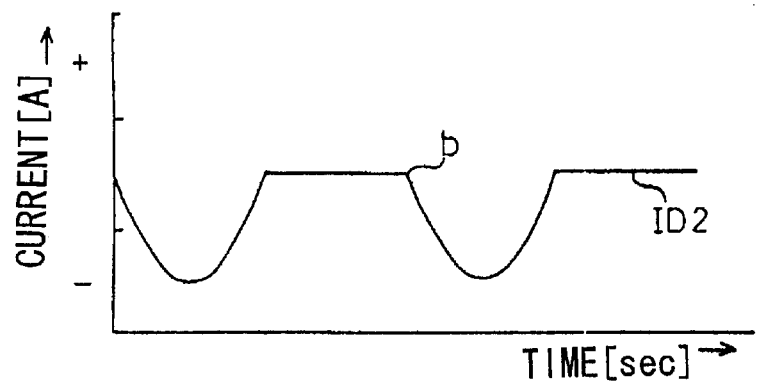
FIG. 12 is a waveform diagram showing drain current of a first N-channel MOS transistor shown in FIG. 1 for receiving the input signal shown in FIG. 7 and driving heavy load.
Figure 13:
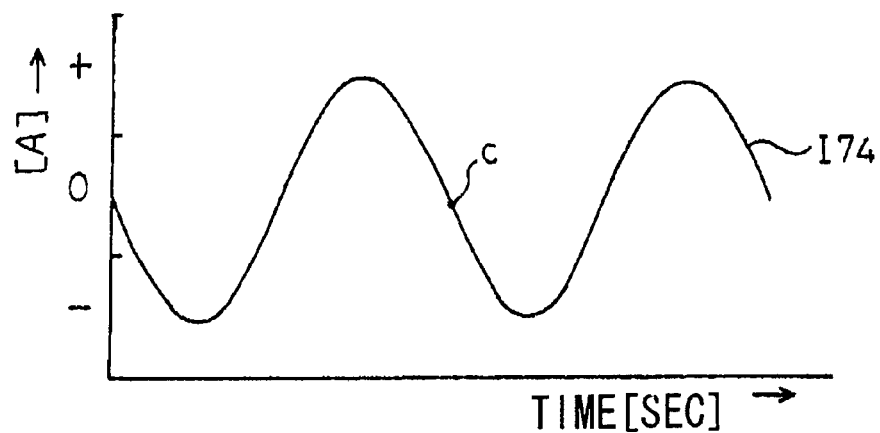
FIG. 13 is a waveform diagram showing output current of the amplifier shown in FIG. 1 for receiving the input signal shown in FIG. 7 and driving heavy load.
Figure 14:
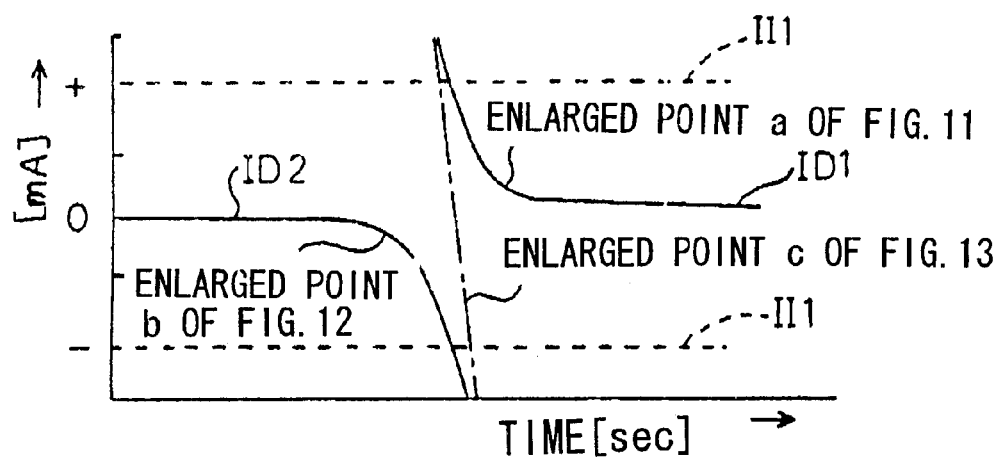
FIG. 14 is a waveform diagram showing to enlarge currents shown in FIGS. 11, 12 and 13 respectively at vicinities of point a, point b and point c.

Under specific power source voltage, when an input signal having a voltage waveform shown in FIG. 7 is provided to the negative phase input terminal VINN of the OP amplifier 1, in the case of light load, voltage waveforms of the respective terminals are as shown by FIG. 8 and current waveforms thereof are as shown by FIG. 9. In FIG. 8, as voltage at the terminal 72, the output signal of the OP amplifier 1 is reverted and oscillated centering on potential of the terminal 72 shown by FIG. 5 and similarly, as voltage of the terminal 73, the output signal of the OP amplifier 1 is reverted and oscillated centering on voltage of the terminal 73 shown in FIG. 5. Thereby, the drain currents ID1 and ID2 and the current I74 are provided as shown by FIG. 9. Further, in the case of heavy load, the voltage waveforms of the respective terminals are as shown by FIG. 10, drain currents ID1 and ID2 are respectively as shown by FIG. 11 and FIG. 12 and the output current I74 is as shown by FIG. 13. Further, FIG. 14 shows enlarged views at timings a, b and c of FIGS. 11 through 13. As is apparent also from the drawing, the drain currents ID1 and ID2 are not interrupted simultaneously and there are provided the voltage 74 and the current I74 having small crossover distortion.

As described above, according to the example, the constant idling currents can be made to flow to the first P-channel MOS transistor Tr1 and the first N-channel MOS transistor Tr2 constituting the power buffer in a wide power source voltage range, the first P-channel MOS transistor Tr1 and the first N-channel MOS transistor Tr2 are not made OFF simultaneously and an output signal having small crossover distortion can be provided.

According to the example, respective constituent elements can be integrated on the same substrate, the temperature characteristic of the second P-channel MOS transistor Tr3 substantially coincides with that of the first P-channel MOS transistor Tr1, the voltage of the terminal 72 operates to cancel temperature variation of the drain current of the first P-channel MOS transistor Tr1 and temperature compensation of the drain current of the first P-channel MOS transistor is carried out. Also with respect to the first N-channel MOS transistor Tr2, similar temperature compensation is carried out by the second N-channel MOS transistor. Therefore, the amplifier of the example can operate stably independently from temperature variation.

Figure 18:
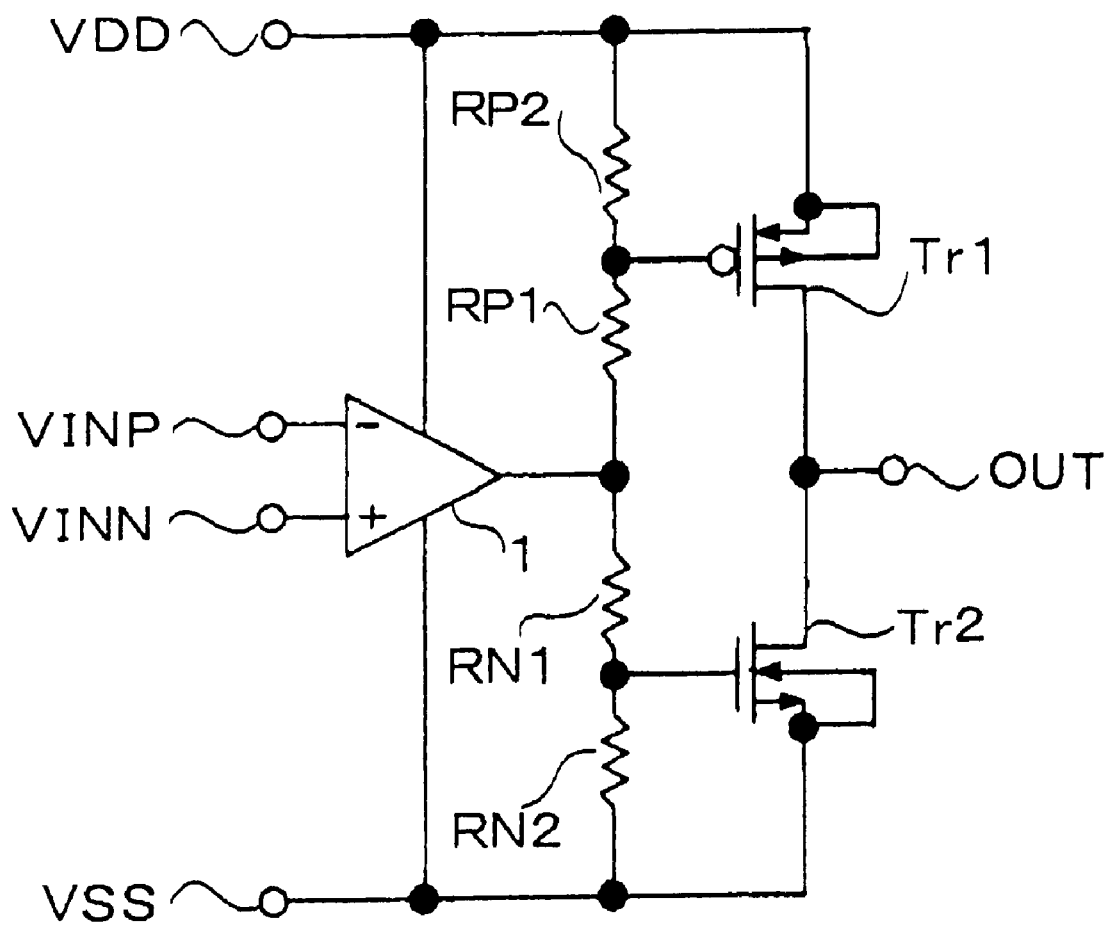
FIG. 18 is an electric circuit diagram for explaining a constitution of a conventional amplifier.
Figure 19:
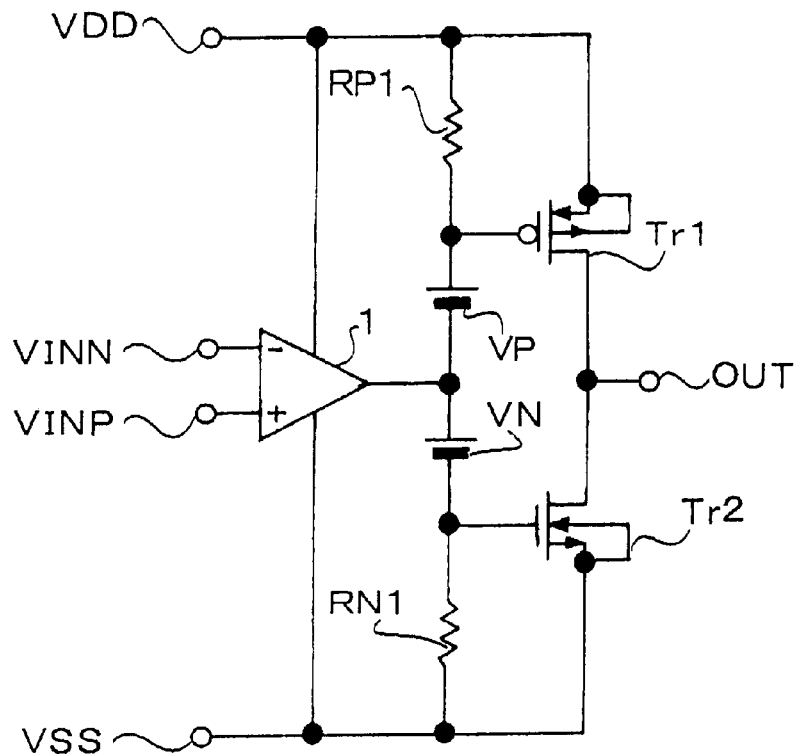
FIG. 19 is an electric circuit diagram for explaining a constitution of a conventional amplifier.
Figure 20:
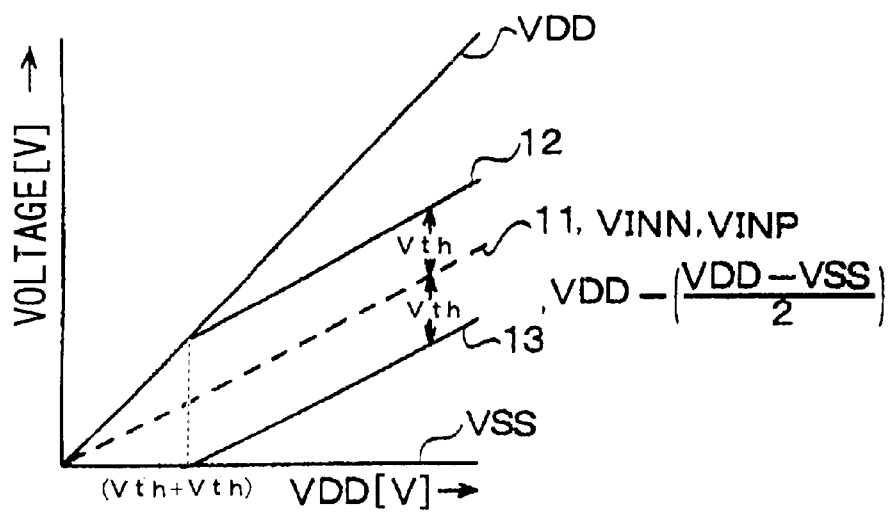
FIG. 20 is a characteristic diagram showing a relationship among voltages of respective terminals and power source voltage of the amplifier shown in FIG. 17.
Figure 21:
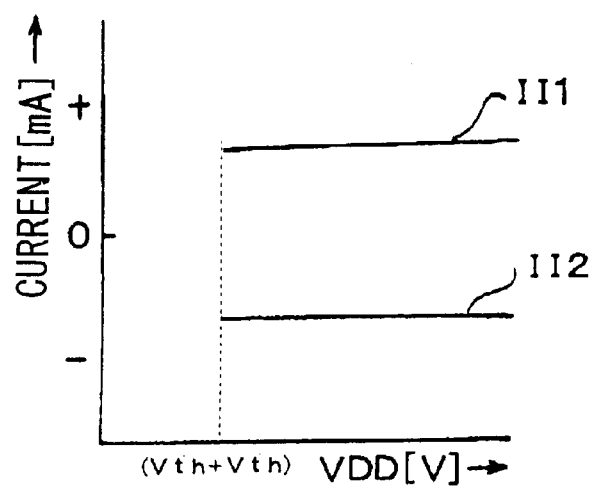
FIG. 21 is a characteristic diagram showing a relationship among currents of the respective terminals and the power source voltage of the amplifier shown in FIG. 17.
Figure 22:
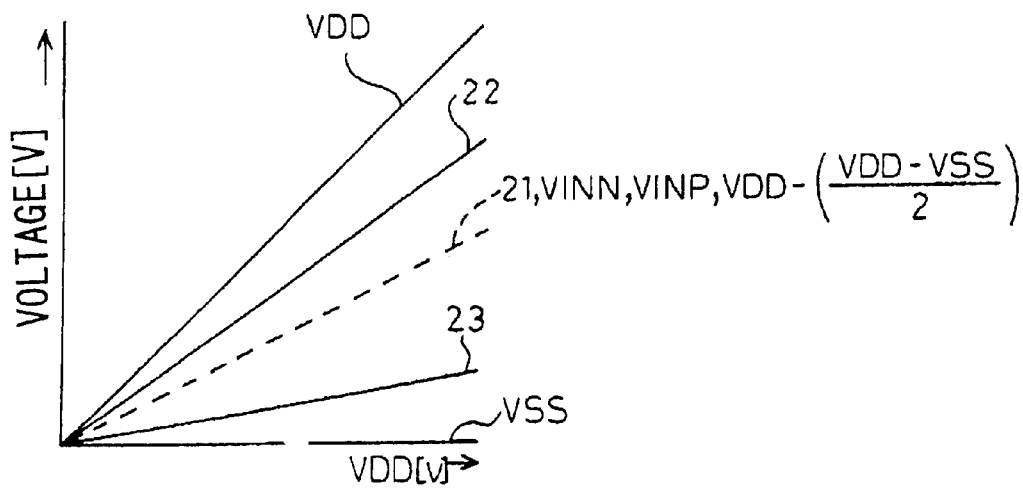
FIG. 22 is a characteristic diagram showing a relationship among voltages of respective terminals and power source voltage of the amplifier shown in FIG. 18.
Figure 23:
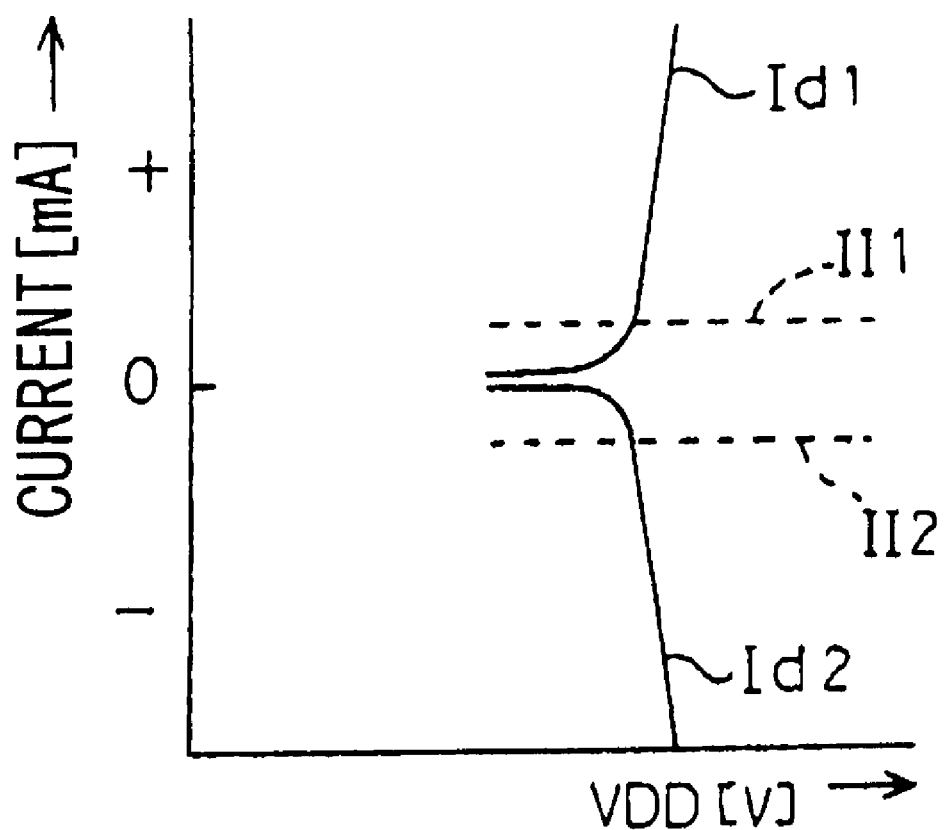
FIG. 23 is a characteristic diagram showing a relationship among currents of the respective terminals and the power source voltage of the amplifier shown in FIG. 18.

As described above, the outputs of the OP amplifier 2 and the OP amplifier 3 respectively provided to the first P-channel MOS transistor Tr1 and the first N-channel MOS transistor Tr2, can swiftly follow the inputs, the first P-channel MOS transistor Tr1 and the first N-channel MOS transistor Tr2 can equivalently be driven at low impedance and the frequency characteristic of the amplifier can be promoted. Further, according to the first P-channel MOS transistor Tr1 and the first N-channel MOS transistor Tr2, the gates are held at high impedance in view from the sources and accordingly, high frequency is not attenuated by forming low pass filtering circuit by gate capacitances and resistors by high impedance formation by resistors for setting gate biases as in the related art shown in FIG. 18.

Further, the resistors R1B and R1C are set to the same value or approximately the same value and the resistors R2B, R3B, R2C and R3C are set to the same value or approximately the same value. The resistors R4B and R4C are set to a value sufficiently larger than the values of the six resistors and the same value or approximately the same value, similarly, the resistors R5B and R5C are set to a value sufficiently larger than values of the six resistors and the same value or substantially the same value. The first P-channel MOS transistor Tr1 and the second P-channel MOS transistor Tr3 are set to the same characteristic or approximately the same characteristic and the first N-channel MOS transistor Tr2 and the second N-channel MOS transistor Tr4 are set to the same characteristic or approximately the same characteristic. Thereby, dispersion in the respective element is difficult to be dependent upon the absolute value and by only promoting relative accuracy thereof, values of the idling currents II1 and II2 can be converged to desired values without adjustment independently from dispersion in view of fabrication.

Further, as shown by FIGS. 2 and 3, regardless of whether potentials of the terminals 72 and 73 are higher or lower than intermediary potential, there is generated bias voltages sufficiently for driving the first P-channel MOS transistor Tr1 and the first N-channel MOS transistor Tr2 and accordingly, according to the invention, alternating current drive of load can be carried out.

Figure 2:
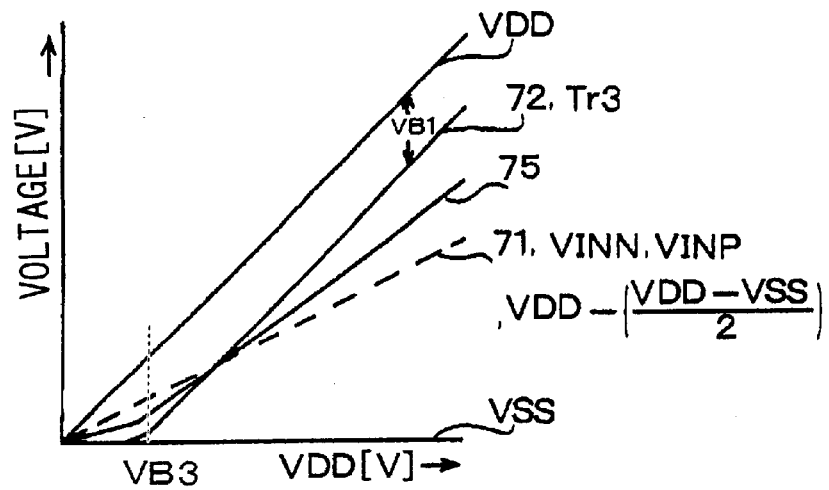
FIG. 2 is a characteristic diagram showing a relationship among voltages of respective terminals and power source voltage of the amplifier shown in FIG. 1.
Figure 15:
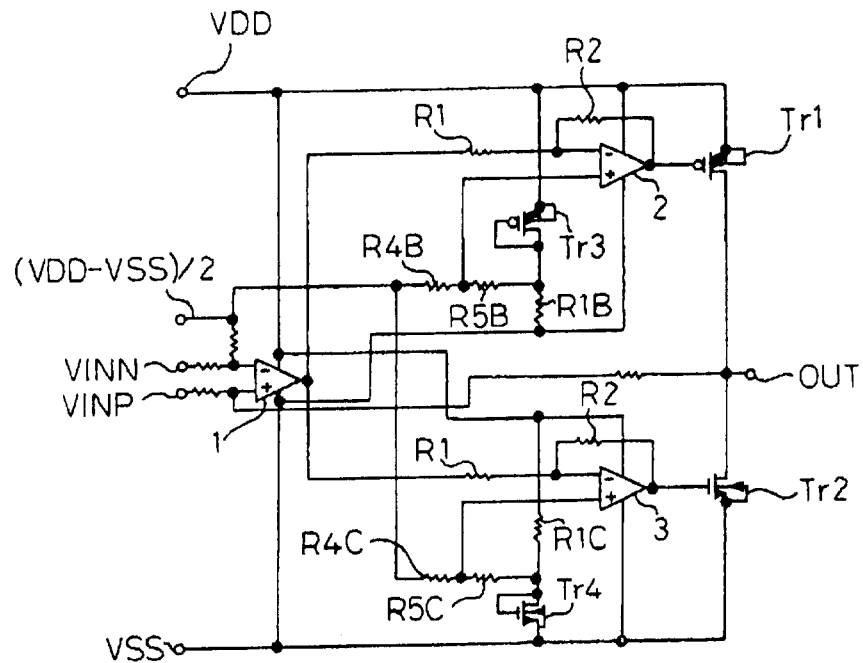
FIG. 15 is an electric circuit diagram for explaining an example in which a portion of the constitution of the amplifier according to the embodiment of the invention is changed.
Figure 16:
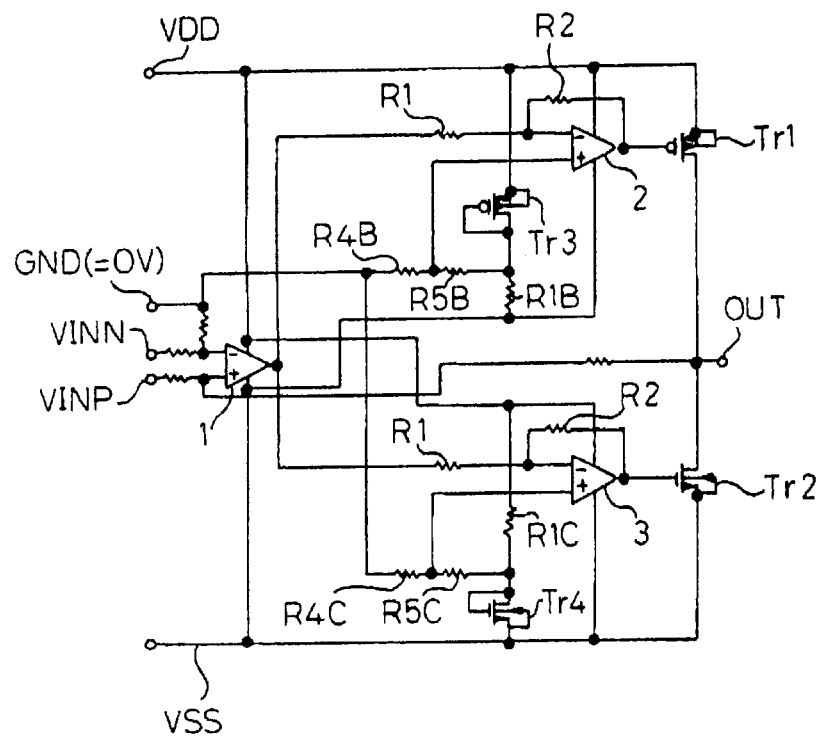
FIG. 16 is an electric circuit diagram for explaining an example in which a portion of a constitution of an amplifier according to the embodiment of the invention is changed.
Figure 17:
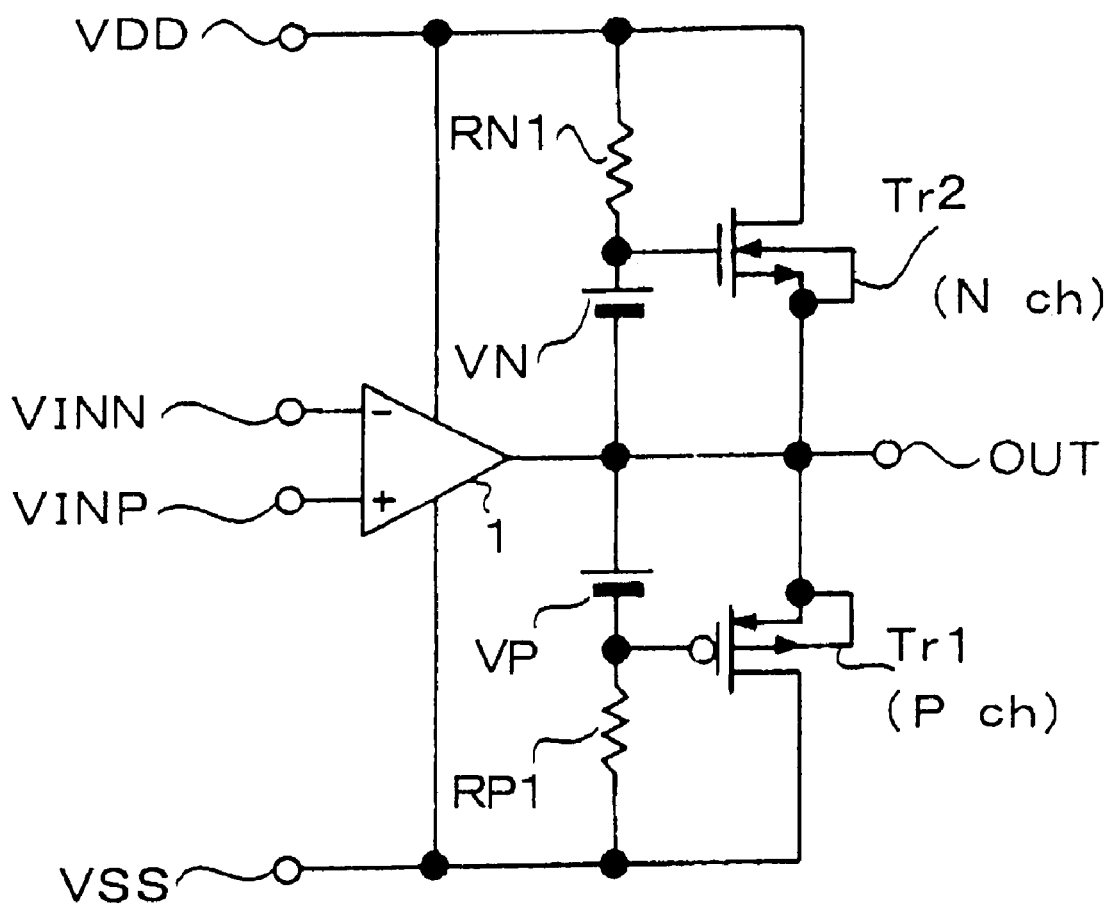
FIG. 17 is an electric circuit diagram for explaining a constitution of a conventional amplifier.

Although according to the embodiment shown in FIG. 1, intermediary potentials are separately generated by using the resistors R2B, R3B, R2C and R3C of the bridge circuits 5 and 6, as shown by FIG. 15, common intermediary potential may be constituted. Further, when absolute values of potentials of the positive power source terminal VDD and the negative power source terminal VSS are made positive and negative power source voltages, for example, the positive power source terminal VDD is set to +1.5V and the negative power source terminal VSS is set to −1.5V, as shown by FIG. 16, the common intermediary potential may be set to ground potential GND.

According to the invention, the voltage values provided to the positive phase input terminals of the second and the third amplifiers are respectively made to correspond to voltages between the sources and the drains of the second P-channel MOS transistor and the second N-channel MOS transistor, the first P-channel MOS transistors and the first N-channel MOS transistors constituting the power buffers are driven by the output signal of the first operational amplifier via the second and the third amplifiers and accordingly, there can be provided idling currents independently from the power source voltage from the low power source voltage and there can be provided the output signal having small crossover distortion in a wide power source voltage range. Accordingly, low power source voltage formation of the amplifier can be carried out.

Further, variations of characteristics of the first P-channel MOS transistor and the second N-channel MOS transistor by temperature can be canceled by each other and temperature dependency of the amplifier can be improved.

Further, the gates of the transistors constituting the power buffers can equivalently be driven at low impedances while holding high impedances in view from the sources and the frequency characteristic can be promoted.

What is claimed is:

1. An amplifier comprising:
   a first operational amplifier for receiving an input signal;
   a power buffer connecting respective drains of a first P-channel MOS transistor and a first N-channel MOS transistor and providing an output terminal at a connection point for connecting the first P-channel MOS transistor and the first N-channel MOS transistor;
   a second P-channel MOS transistor having a temperature characteristic the same as a temperature characteristic of the first P-channel MOS transistor;
   a second N-channel MOS transistor having a temperature characteristic the same as a temperature characteristic of the first N-channel MOS transistor;
   a second operational amplifier for receiving a voltage based on a voltage between a source and a drain of the second P-channel MOS transistor at a positive phase input terminal thereof, receiving an output signal of the first operational amplifier at a negative input terminal thereof, generating an output signal constituting a potential center of a voltage waveform by a potential lowered from a potential of a source of the first P-channel MOS transistor by an amount in correspondence with the voltage between the source and the drain of the second P-channel MOS transistor and driving the first P-channel MOS transistor by the output signal; and
   a third operational amplifier receiving a voltage based on a voltage between a source and a drain of the second N-channel MOS transistor at a positive input terminal thereof, receiving the output signal from the first operational amplifier at a negative phase input terminal thereof, generating an output signal constituting a potential center of a voltage waveform higher than a potential of a source of the first N-channel MOS transistor by an amount in correspondence with the voltage between the source and the drain of the second N-channel MOS transistor and driving the first N-channel MOS transistor by the output signal.

2. An amplifier comprising:
   a first operational amplifier for receiving an input signal;
   a power buffer connecting a source of a first P-channel MOS transistor to a first power source terminal at a first potential, connecting a source of a first N-channel MOS transistor to a second power source terminal at a potential lower than the first potential, connecting drains of the first P-channel MOS transistor and the first N-channel MOS transistor and providing an output terminal at a connection point connecting the drains;
   a second P-channel MOS transistor connecting a source thereof to the first power source terminal, connecting a drain thereof to the second power source terminal via a first resistor and connecting a gate thereof and the drain;
   a second N-channel MOS transistor connecting a source thereof to the second power source terminal, connecting a drain thereof to the first power source terminal via a second resistor and connecting a gate thereof and the drain;
   a second operational amplifier receiving a voltage provided by dividing by resistors, between a terminal at a specific potential between the first potential and the second potential and the drain of the second P-channel transistor at a positive phase input terminal thereof, receiving an output signal of the first operational amplifier at a negative phase input terminal thereof and driving the first P-channel MOS transistor by the output signal; and
   a third operational amplifier receiving a voltage provided by dividing by resistors, between the terminal at the specific potential and the drain of the second N-channel transistor at a positive phase input terminal thereof, receiving the output signal of the first operational amplifier at a negative phase input terminal thereof and driving the first N-channel MOS transistor by the output signal.

3. The amplifier according to claim 2:
   wherein the specific potential is an intermediary potential between the first potential and the second potential, a voltage produced at a connection point for connecting a pair of resistors connected between the terminal at the specific potential and the drain of the second P-channel MOS transistor, is provided to the positive phase input terminal of the second amplifier and a voltage produced at a connection point for connecting a pair of resistors connected between the terminal at the specific potential and the drain of the second N-channel MOS transistor, is provided to the positive phase input terminal of the third amplifier.

4. The amplifier according to any one of claims 1 through 3:
   wherein a feedback resistor is provided between a negative phase input terminal of the first operational amplifier and the output terminal of the power buffer.

5. The amplifier according to any one of claims 1 through 3:
   wherein the second operational amplifier and the third operational amplifier are provided with a unity gain.

6. The amplifier according to any one of claims 1 through 3:
   wherein the first P-channel MOS transistor, the second P-channel MOS transistor and the second N-channel MOS transistor are formed on a same substrate.

* * * * *